(12) United States Patent
Powrie

(10) Patent No.: US 10,107,840 B1
(45) Date of Patent: Oct. 23, 2018

(54) SIGNAL ANALYZER GENERATOR

(71) Applicant: Don Louis Powrie, Allen, TX (US)

(72) Inventor: Don Louis Powrie, Allen, TX (US)

(73) Assignee: Don Powrie, Allen, TX (US)

( * ) Notice: Subject to any disclaimer, the term of this patent is extended or adjusted under 35 U.S.C. 154(b) by 0 days.

(21) Appl. No.: 15/637,530

(22) Filed: Jul. 17, 2017

(51) Int. Cl.
G08B 5/36 (2006.01)
G01R 19/02 (2006.01)
G01R 19/25 (2006.01)
G01R 13/02 (2006.01)

(52) U.S. Cl.
CPC ......... *G01R 19/02* (2013.01); *G01R 13/0281* (2013.01); *G01R 19/2506* (2013.01); *G08B 5/36* (2013.01)

(58) Field of Classification Search
CPC G01R 19/02; G01R 19/2506; G01R 13/0281; G08B 5/36
See application file for complete search history.

(56) References Cited

U.S. PATENT DOCUMENTS

| 7,385,519 | B2* | 6/2008 | Weems, II | G01R 35/00 324/556 |
| 8,463,953 | B2* | 6/2013 | Davis | G06F 13/10 710/16 |
| 8,615,870 | B1* | 12/2013 | Neu | G01R 31/006 29/739 |
| 9,117,319 | B2* | 8/2015 | Chen | G07C 5/008 |
| 9,134,100 | B2* | 9/2015 | Martinez-Tovar | F42B 3/13 |
| 9,664,708 | B2* | 5/2017 | Dorman | G01R 1/06788 |
| 2018/0024534 | A1* | 1/2018 | Russell, III | G05B 19/4148 |

* cited by examiner

*Primary Examiner* — Michael C Zarroli
(74) *Attorney, Agent, or Firm* — Pro Se

(57) ABSTRACT

The Signal Analyzer Generator is comprised of a small form-factor electronic device used for measuring and generating electrical signals. The electrical signal interface is comprised of a two-pin connector in which the two pins are spaced 0.1 inches apart such that they connect to prototyping breadboards using two-pin male or female header pins. The purpose of the specific spacing design is to take advantage of the existing hardware owned by potential users of this technology and completely eliminate the need for electrical test leads that would otherwise clutter the workspace.

The Signal Analyzer Generator can measure AC and DC voltages, temperature, humidity and current; and it can also generate both sine- and square-wave electrical signals—all of which are commonly used by technicians, engineers and hobbyists.

Other unique aspects of the Signal Analyzer Generator are that it can be externally powered or run on its primary battery for power, the ability to stand upright supporting its own weight using only the two header pins, the auto-power-off feature and its ability to connect to a host PC for the logging of measured data.

1 Claim, 3 Drawing Sheets

SIGNAL ANALYZER GENERATOR

The Signal Analyzer Generator is an electronic device that measures or generates electrical signals for the user with the intention of eliminating long test leads from the workspace thereby reducing clutter while also freeing the user's hands for other tasks. It also allows for the taking of many dense measurements within a small space using its 0.1-inch spaced female header to connect to user electronics such as industry-standard, 0.1-inch spaced prototyping breadboards and 0.1-inch spaced male headers. The Signal Analyzer Generator can also stand upright facing the user using the 2-pin header to support its own weight.

FIELD OF THE INVENTION

The present invention relates generally to a piece of electrical test equipment providing real-time measurement or generation of electrical signals including the option of data collection via external connection or varying electrical signals sweeping over a range, generally for test purposes. The device measures or generates electrical signals while allowing the user's hands to remain free for other tasks.

BACKGROUND

Currently there are no other such multimeters which eliminate the requirement for test leads and also directly connect to the breadboards commonly used by technicians, engineers and hobbyists when building and debugging an electrical circuit. The 0.1-inch spacing of the two-pin header as utilized by the Signal Analyzer Generator allows it to quickly and easily make electrical and mechanical connection between the Signal Analyzer Generator and the user's circuit. There are voltmeters for measuring voltage; but most, if not all, require the use of electrical test leads. Existing voltmeters use test leads which tend to clutter the work area and require the use of hands to hold the test leads. Currently there is not a solution to address this problem.

In general, the device looks like a small piece of test equipment with an internal circuit board and LEDs (Light-Emitting Diodes) or an LCD display together with a microcontroller and battery behind an LED light diffuser that also serves as a product label. A switch is used to start and stop the device. The LED's display the value of the measured or generated electrical signal. Other LEDs are used to indicate the range of the electrical signal being generated, the battery-low condition and confirmation that a new setup has been successfully saved to permanent memory within the device. Therefore, there currently exists a need in the industry for a device that helps unclutter the work area and keep the user's hands free while also measuring and generating electrical signals.

SUMMARY OF THE INVENTION

The present invention advantageously fills the aforementioned deficiencies by providing an industry-standard electrical and mechanical interface commonly used by technicians, engineers and hobbyists.

The end user can either push the Signal Analyzer Generator's female header onto a pair of male header pins to measure the signal present, or a two-pin male header can be pressed into the female header and the other end of the male header pins can be pressed into the user's breadboard. In either case, signals present can then be measured, and the Signal Analyzer Generator will hold itself upright so that the display can be easily read by the user.

This invention provides a differential input that converts the electrical signal to be measured into one with the correct voltage range such that is can be easily measured while not also requiring that one of the two pins in the female header be electrically connected to ground within the Signal Analyzer Generator. Ground isolation is important for protecting user electronics.

Another current feature is that the device goes to sleep after a user-programmable amount of time has transpired. The LEDs consume considerable power, and this feature helps ensure a longer life for the battery.

Additional features could be the ability to measure temperature and humidity. Another possible feature could be for the device to measure electrical current in the user's circuit.

LEDs are used so that measured or generated signals can be easily recognized in daytime, nighttime or under zero-light conditions.

Two separate LEDs independently show when a battery-low condition exists and when a new user-setup selection has been saved to permanent memory. Firmware running in the microcontroller collects the battery-level data continuously. Samples are averaged for accuracy to greatly reduce any noise or false readings.

A switch is used to select the AC or DC mode of operation. In AC mode, a series capacitor is used to block DC and only allow AC to be measured. In this mode, numerous voltage readings are acquired, and a true RMS (Root Mean Square) voltage is calculated. In DC mode, numerous voltage readings are accumulated, and a simple average is calculated before the voltage is presented to the user. The state of the AC/DC switch is also monitored by the microcontroller so that it knows when the user has changed modes.

The device has been optimized for low energy consumption such that it will last for many test and measurement sessions under battery power. When turned off, battery consumption is equal to the shelf-life duration of the battery itself.

This device may also be attached to other powered machines designed for data presentation, logging and control.

The present invention will now be described more fully hereinafter with reference to the accompanying drawings, which are intended to be read in conjunction with both this summary, the detailed description and any preferred and/or particular embodiments specifically discussed or otherwise disclosed. This invention may, however, be embodied in many different forms, and it should not be construed as limited to the embodiments set forth herein; rather, these embodiments are provided by way of illustration only and so that this disclosure will be thorough, complete and will fully convey the entire scope of the invention to those skilled in the art.

DETAILED DESCRIPTION OF THE INVENTION

The present invention is directed to a test and measurement device that is easy and convenient to use for the purpose of measuring and generating electrical signals.

Figure 1:
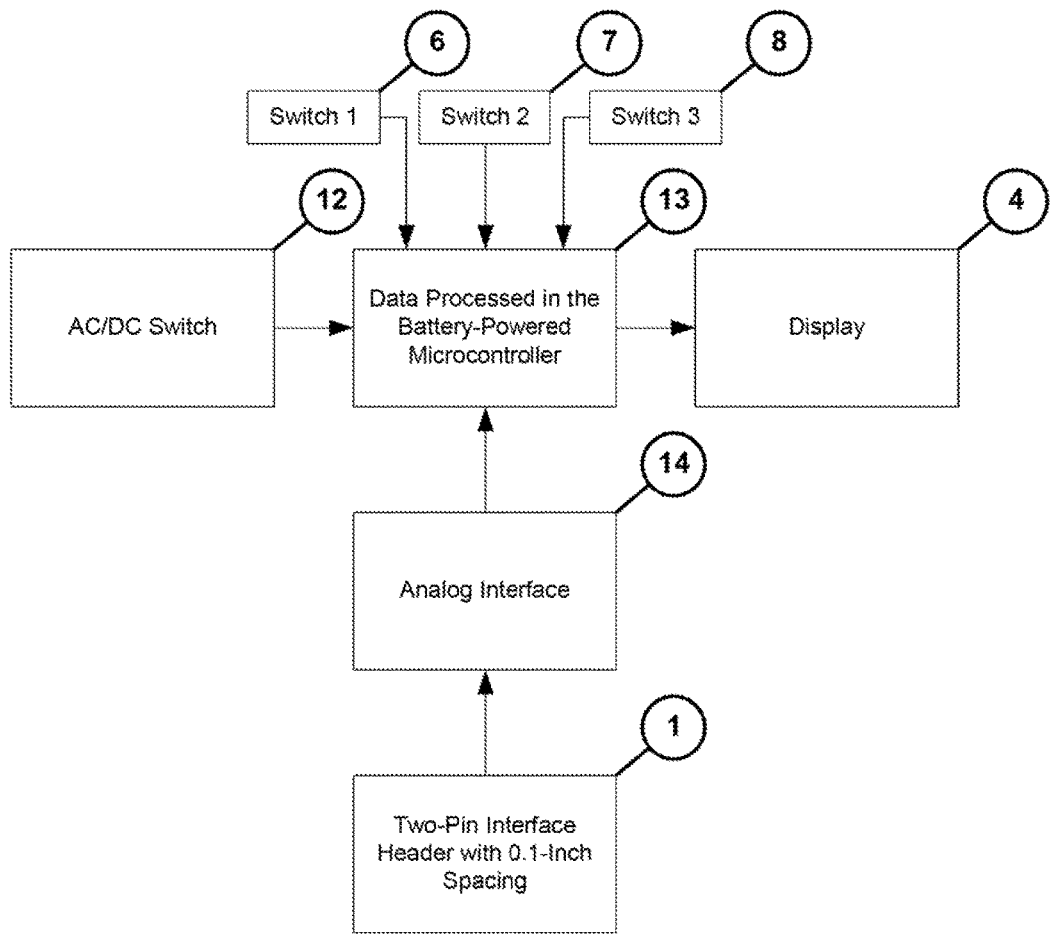
FIG. 1 shows the flow diagram of measured data coming into the device and how that data is processed and displayed in condensed form.
Figure 2:
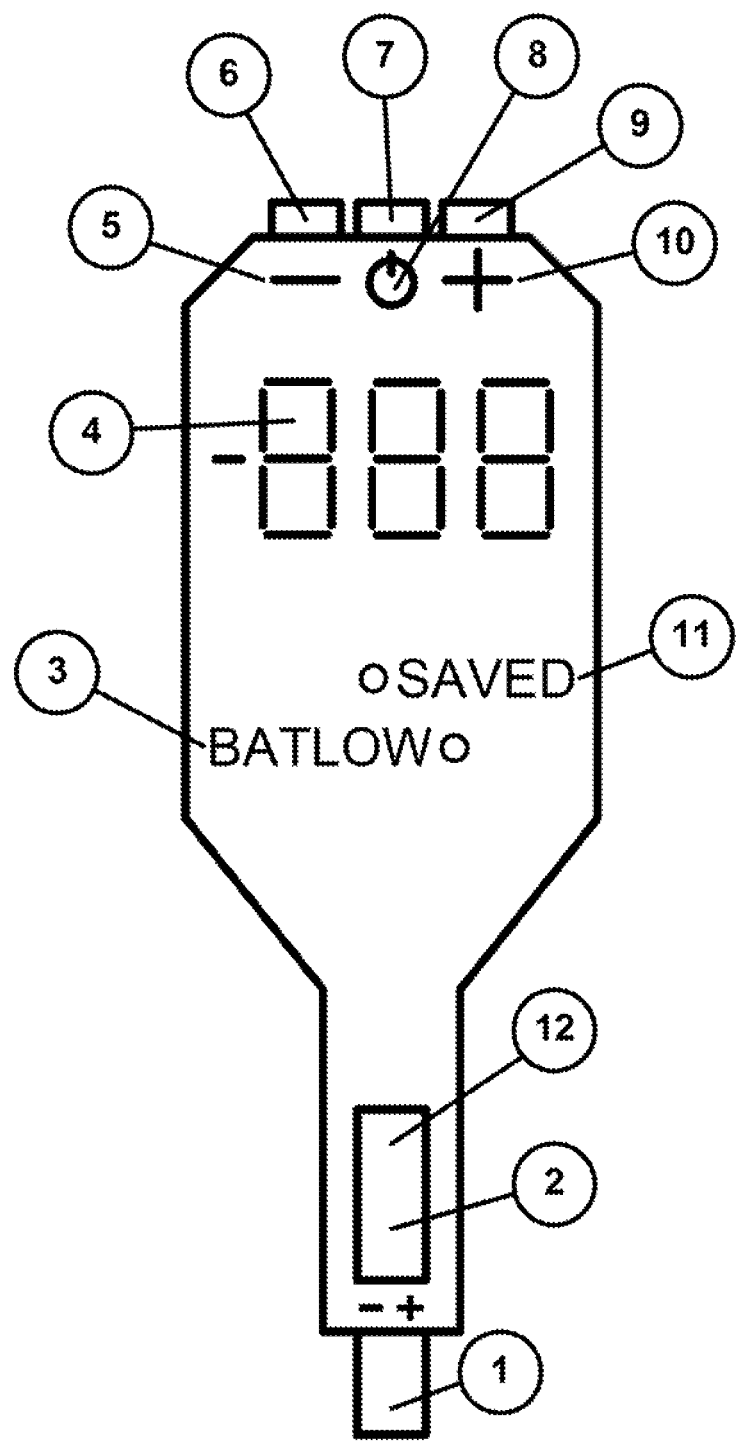
FIG. 2 shows a working prototype device with the two-pin female header and LED display.

In its most complete version see FIG. 2, the system of the present invention is made up of the following components:

There is a start switch 7 which has been configured so that when a user pushes the switch, the device turns on. This switch is also used for changing the auto-power-off feature setting. The microcontroller FIG. 1 starts measuring voltages applied via the two-pin header 1. This data is processed to determine the voltage applied by the user circuit. Through firmware this raw data is processed to acquire either an average or a true RMS value of the voltage being measured. LEDs (Light Emitting Diodes) 4 as illustrated in FIGS. 1 and 2 display the resulting voltage.

There are two additional switches 6, 9 for making user selections of the settings. One of the switches 6 is used for decreasing a setting 5, and the other 9 is used for increasing a setting 10.

Measured voltage data is presented to the user via multiple LEDs 4 that are located internally to the device. The light from these LEDs passes through a diffuser to make the display more readable. An LED 3 is used to indicate when a low-battery condition has occurred and the user needs to replace the battery. An additional LED 11 is used to indicate when a user-definable setting has changed and saved to permanent memory. A switch 12 is used to allow the user to change modes between AC and DC. The microcontroller 13 also reads the state of this switch to know what algorithm is to be used in determining the actual voltage measured. Additional LEDs 2 of different colors are used to indicate frequency range when in generator mode. One color indicates MHz, a second indicates KHz and a third indicates Hz.

All voltages that are to be measured by the user are applied via the two-pin female header 1. An analog interface circuit 14 provides a high-impedance, differential input buffer, thereby removing any reference to system ground.

Various capacitors and resistors are used to limit current to the LED's and achieve proper function of the input buffer and microcontroller. The system is powered from a single battery or via the header on the rear of the unit where an external power source can be used. The device is made of typical industry plastics, diffuser material and retaining clips to hold the product packaging together.

Figure 3:
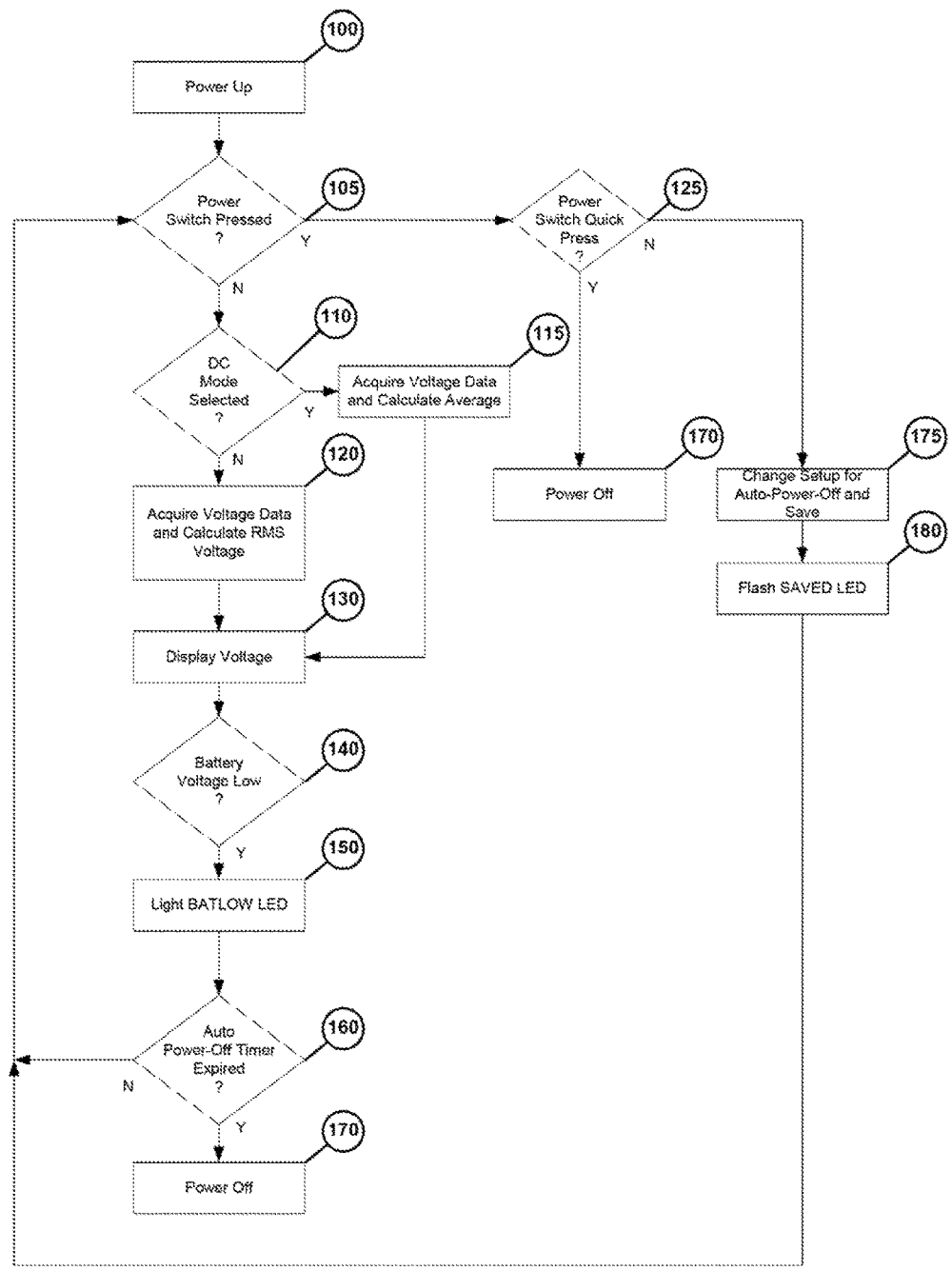
FIG. 3 shows the electrical design block diagram.

With respect to the firmware, in its most complete and preferred version, it is made up of the following executable steps (see FIG. 3 for the flowchart). The microcontroller 13 is woken 100 by an interrupt when an external switch 7 is pushed on the device. At this point the device begins normal operation. Multiple voltage data points are read and accumulated and averaged to greatly reduce false or noisy sample readings. This gives an accurate voltage measurement. Once the firmware arrives at the actual voltage being measured, it is presented on the LED display 4.

At this point, if the power switch 7 is pressed again 105 and immediately released 125 the device will power down 170. If the switch is held 175; then the setup of the auto-power-off mode can be changed, and the new setup is stored 180.

If normal operation continues 105 measuring voltages, the device sequences through the firmware as follows: The setting of the AC/DC switch 12 is determined by the microcontroller 13 110. Depending upon the setting of the switch, the firmware in the microcontroller 13 will either calculate the DC voltage as a simple average 115 or using an algorithm for determining the AC RMS value 120. The final voltage data is then presented on the LED display 130 4. The battery voltage is measured 140, and if it is determined to be low, the BATLOW LED 3 will be activated 150. If the auto-power-off timer has expired 160, then the device is powered off 170.

While the present invention has been described above in terms of specific embodiments, it is to be understood that the invention is not limited to these disclosed embodiments. Upon reading the teachings of this disclosure, many modifications and other embodiments of the invention will come to the mind of those skilled in the art to which this invention pertains and which are intended to be and are covered by both this disclosure and the appended claims. It is indeed intended that the scope of the invention should be determined by proper interpretation and construction of the appended claims and their legal equivalents as understood by those of skill in the art relying upon the disclosure in this specification and the attached drawings.

The invention claimed is:

1. A Signal Analyzer Generator comprised of a printed circuit board, battery,
    a multi-pin female header protruding from the said printed circuit board for both electrical connection to user circuitry and for mechanically holding the product in an upright position,
    a mechanical design that utilizes a multi-pin header with 0.1-inch spacing between the header pins that can be configured as either male (by inserting a 2-pin male header) or female polarity for both the electrical interface to user electronics and for mechanical upright support,
    switches for the power on/off control and other product settings, a microcontroller, display, at least two Light-Emitting Diodes configured to emit colored light, resistors and capacitors;
    wherein the Signal Analyzer Generator is configured to be activated when the user presses the power switch, at which time the microcontroller turns on and either generates an electrical signal or accumulates raw data from said 2-pin header in real time and the microcontroller is configured to collect and process the electrical data which is then displayed.

* * * * *